(12) United States Patent
Goodlin et al.

(10) Patent No.: US 9,607,847 B1
(45) Date of Patent: Mar. 28, 2017

(54) ENHANCED LATERAL CAVITY ETCH

(71) Applicant: Texas Instruments Incorporated, Dallas, TX (US)

(72) Inventors: Brian E. Goodlin, Plano, TX (US); Karen H. R. Kirmse, Richardson, TX (US); Iqbal R. Saraf, Wappingers Falls, NY (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/973,904

(22) Filed: Dec. 18, 2015

(51) Int. Cl.
| | |
|---|---|
| H01L 21/326 | (2006.01) |
| H01L 31/00 | (2006.01) |
| H01L 21/3065 | (2006.01) |
| H01L 49/02 | (2006.01) |
| H01L 37/00 | (2006.01) |
| H01L 29/16 | (2006.01) |
| H01L 29/161 | (2006.01) |
| H01L 29/06 | (2006.01) |
| H01L 21/308 | (2006.01) |
| H01L 21/3105 | (2006.01) |

(52) U.S. Cl.
CPC ...... *H01L 21/3065* (2013.01); *H01L 21/3081* (2013.01); *H01L 21/31058* (2013.01); *H01L 28/10* (2013.01); *H01L 29/0657* (2013.01); *H01L 29/16* (2013.01); *H01L 29/161* (2013.01); *H01L 37/00* (2013.01)

(58) Field of Classification Search
CPC ....................................................... H01L 21/762
USPC ......... 438/35, 691, 283, 464, 478, 694, 697, 438/462, 424, 124, 455, 640, 592, 296, 438/99; 257/344, 401, 623, 774, 402, 98, 257/798, 506, 347, 88, 773
See application file for complete search history.

(56) References Cited

U.S. PATENT DOCUMENTS 6,383,938 B2 *  5/2002 Pandhumsoporn  H01L 21/76264
                                                                                       216/62

\* cited by examiner

*Primary Examiner* — Julio J Maldonado
*Assistant Examiner* — Moin Rahman
(74) *Attorney, Agent, or Firm* — Jacqueline J. Garner; Charles A. Brill; Frank D. Cimino

(57) ABSTRACT

A cavity is formed in a semiconductor substrate wherein the width of the cavity is greater than the depth of the cavity and wherein the depth of the cavity is non uniform across the width of the cavity. The cavity may be formed under an electronic device in the semiconductor substrate. The cavity is formed in the substrate by performing a first cavity etch followed by repeated cycles of polymer deposition, cavity etch, and polymer removal.

9 Claims, 4 Drawing Sheets

ENHANCED LATERAL CAVITY ETCH

FIELD OF THE INVENTION

This invention relates to the field of semiconductor devices and more specifically to the formation of a cavity wherein the width of the cavity exceeds the depth in a semiconductor device.

BACKGROUND

Cavities are frequently formed in semiconductor circuits to reduce coupling of a device such as an inductor, heater, or bolometer to the substrate. Typically a cavity is etched into a substrate material such silicon or SiGe through an opening in a dielectric layer overlying the substrate using a substantially isotropic etch. Typically the substantially isotropic etch, etches the cavity vertically faster than it does laterally. Consequently a very deep cavity may need to be formed to completely remove the substrate laterally from under the device to reduce coupling. The deep cavity may weaken the substrate resulting in breakage and yield loss.

One method to avoid etching a deep cavity is to build an etch stop layer into the substrate under the device with the coupling issue. This method may add significant complexity, cycle time, and cost to the manufacturing flow.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A cavity is formed in a semiconductor substrate wherein the width of the cavity is greater than the depth of the cavity and wherein the depth of the cavity is non uniform across the width of the cavity. The cavity may be formed under an electronic device in the semiconductor substrate. The cavity is formed in the substrate by performing a first cavity etch followed by repeated cycles of polymer deposition, cavity etch, and polymer removal.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
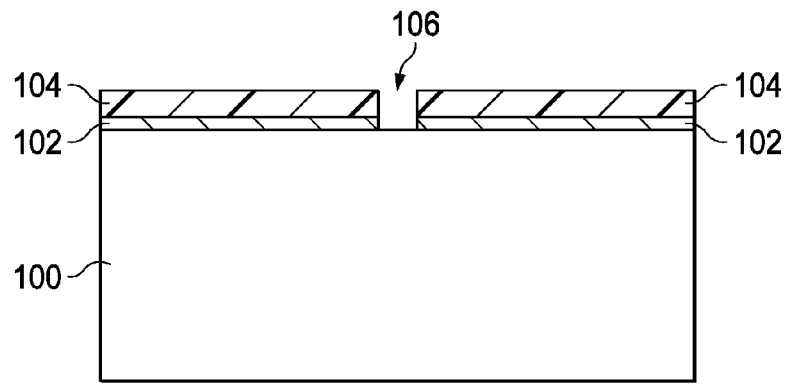
FIG. 1A through FIG. 1J are cross sections illustrating the formation of a cavity in an integrated circuit in successive stages of fabrication according to principles of the invention.
Figure 1B:
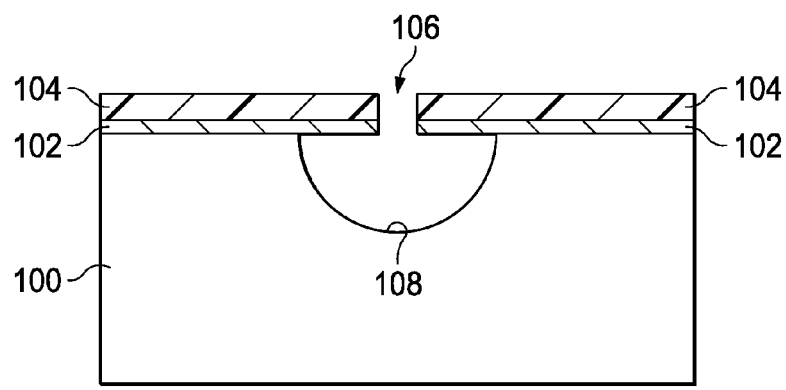
Figure 1C:
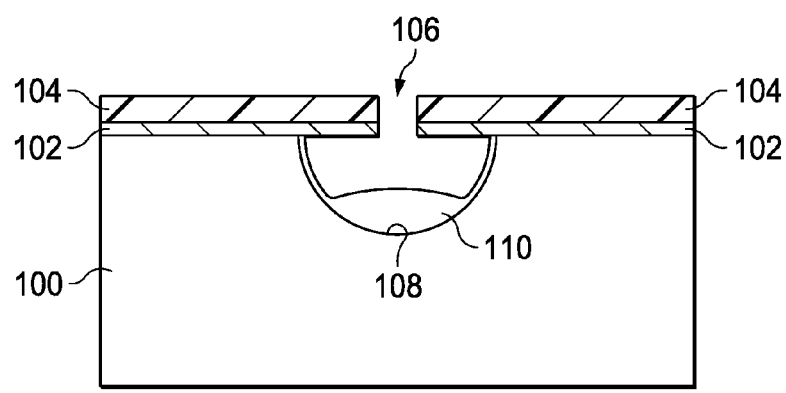
Figure 1D:
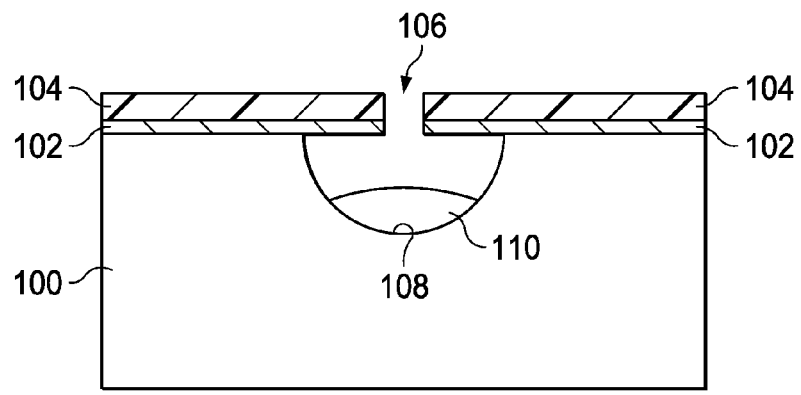
Figure 1E:
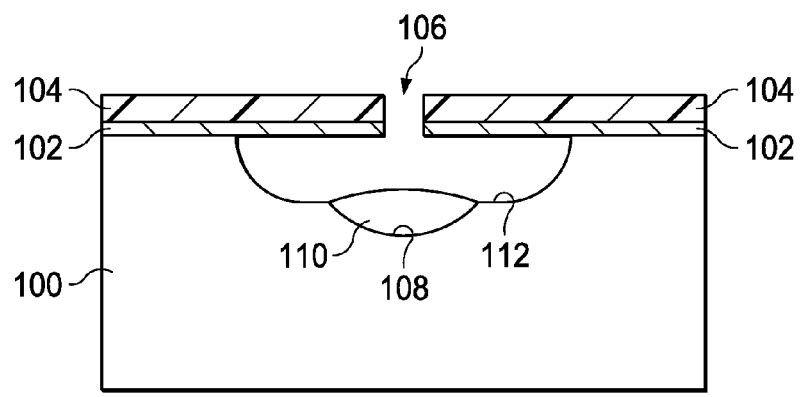
Figure 1F:
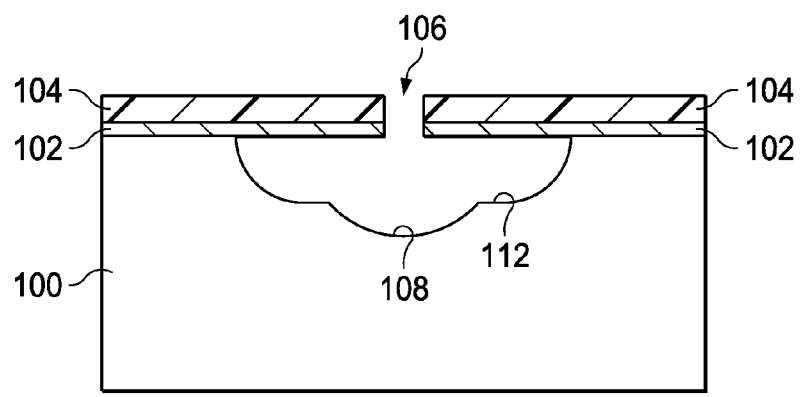

A structure with a cavity that is etched according to embodiments is illustrated in FIG. 1F. The cavity is etched into the substrate 100 using an etch that is substantially isotropic. The cavity is wider than it is deep. The cavity depth is non uniform across the width of the cavity. The cavity is deepest under the opening through which the cavity is etched.

Figure 1G:
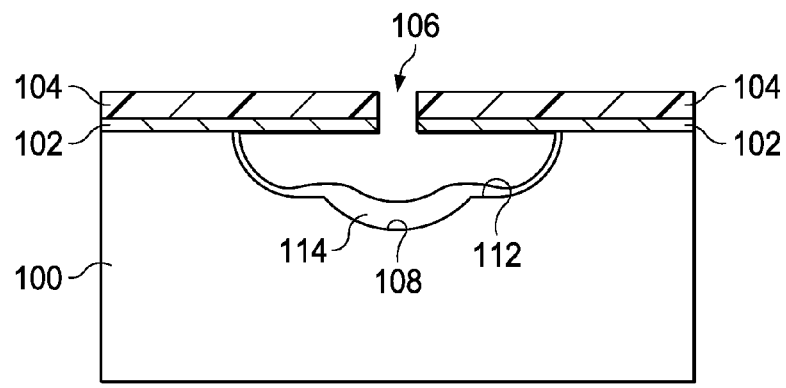
Figure 1H:
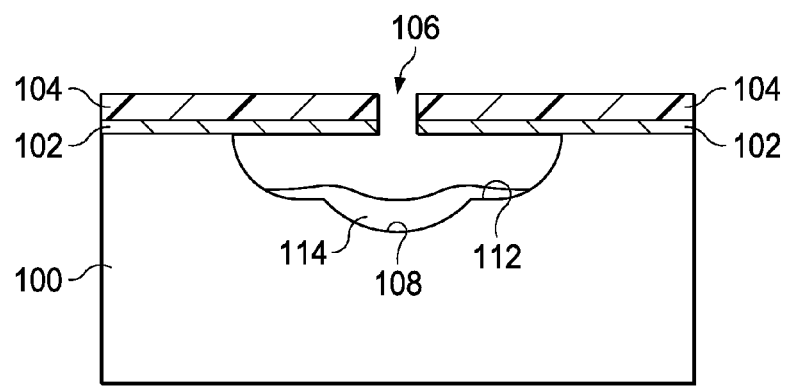
Figure 1I:
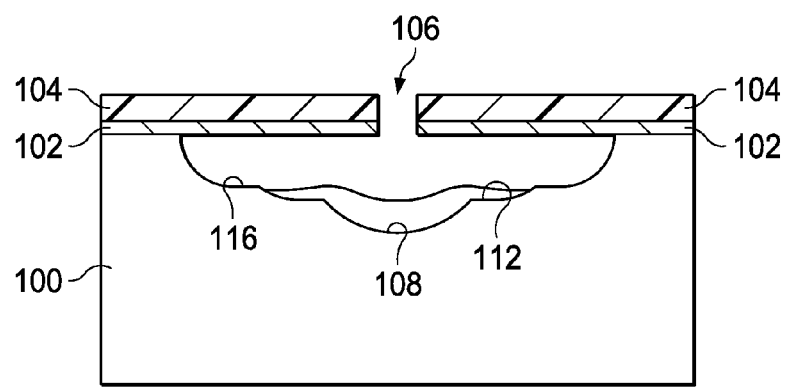
Figure 1J:
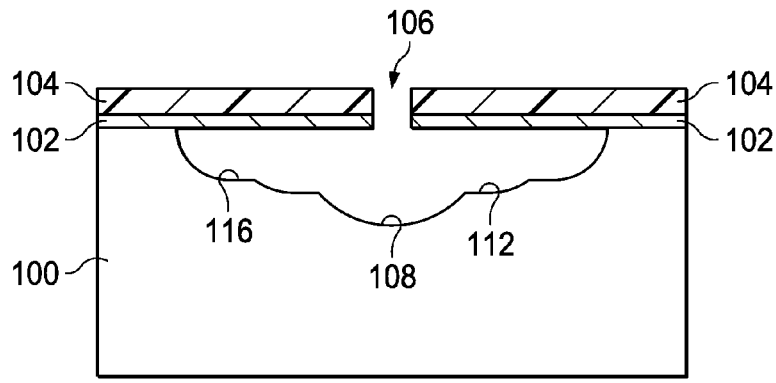
Figure 2:
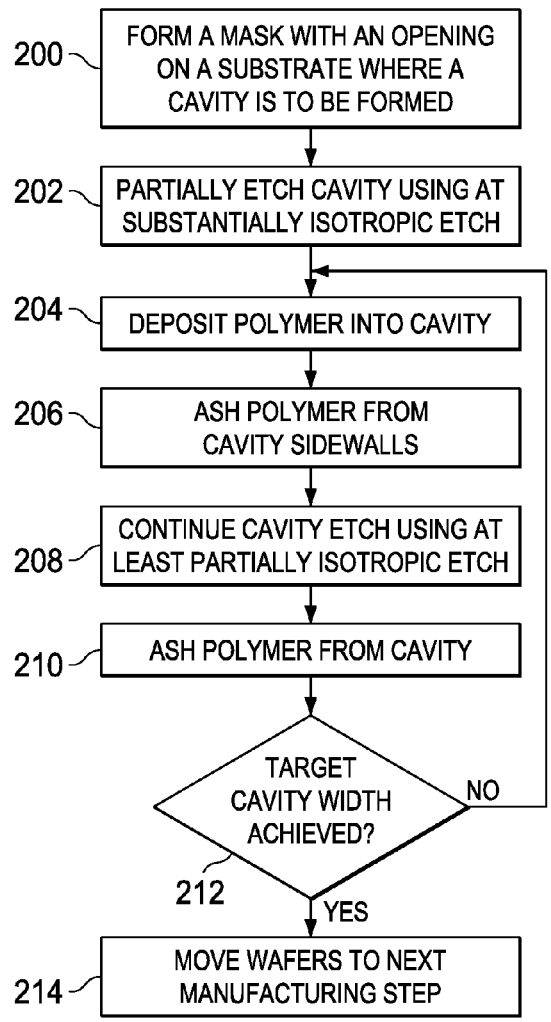
FIG. 2 is flow diagram for the steps in a process of forming a cavity in a substrate according to principles of the invention.

The method for forming a cavity wherein the width of the cavity is substantially wider than the depth of the cavity is described in the process flow in FIG. 2 and in the cross sections in FIGS. 1A through 1J.

FIG. 1A shows a substrate 100 that may be etched using an etchant that etches substantially isotropically, that is, etches laterally as well as vertically. A hard mask (layers 102 and 104) overlies the substrate. The etchant may be introduced through an opening 106 in the hard mask 102/104 to etch a cavity in the substrate 100 (step 200 in FIG. 2). In an example embodiment, the substrate 100 is single crystal silicon and the hard mask is comprised of a layer of silicon nitride 104 which overlies a layer of silicon dioxide 102. One layer of masking material (silicon dioxide for example) may alternatively be used. Other masking materials and other substrates may also be used. The opening 106 in the example embodiment may be in the range of less than a micron to many microns wide depending upon the details of the device being manufactured. In an example embodiment opening 106 is about 25 microns wide.

In first cavity etch step 202 of FIG. 2, etchant is introduced through opening 106 and etches the substrate 100 both vertically and laterally to form a cavity with first cavity etch sidewalls 108 as shown in FIG. 1B. In an example embodiment the silicon substrate 100 is etched in a substantially isotropic manner using a $SF_6$ plasma etch. In the example embodiment, the $SF_6$ etches the silicon approximately twice as fast vertically as laterally through the opening 106.

Example cavity etch process conditions are 225 mT pressure, 4000 Watts source power, 0 Watts bias power, 1000 sccm $SF_6$, and a temperature of 15° C.

In step 204 of FIG. 2 polymer 110 is formed on the bottom and sidewalls 108 of the first etched cavity as shown in FIG. 1C. Typically the polymer 110 is thicker on the bottom of the cavity under the opening 106 and gets thinner on the sidewalls 108 of the cavity away from under the opening 106. The polymer deposition step is typically performed using a plasma with a fluorocarbon gas, $C_xH_yF_z$, such as $CH_4$, $CHF_3$, $CH_2F_2$, $C_2F_6$, $C_3F_6$, and $C_4F_8$.

Example polymer deposition process conditions are 10 mT pressure, 3800 Watts source power, 0 Watts bias power, 200 sccm $C_4F_8$, and a temperature of 15° C.

In step 206 of FIG. 2 an optional ashing step may be performed to remove the polymer from the sidewalls 108 of the cavity where the polymer is thin as shown in FIG. 1D. In some cases so little polymer may be formed in the sidewalls that a separate ashing step is unnecessary. Instead a breakthrough etch step to remove minor amounts of polymer may be performed at the beginning of the subsequent SF$_6$ silicon etch. In the example embodiment a plasma ashing step with oxygen is used.

Example ashing process conditions are 30 mT pressure, 2500 Watts source power, 0 Watts bias power, 200 sccm oxygen, and a temperature of 15° C.

In step 208 of FIG. 2, a second cavity etch is performed as shown in FIG. 1E. The polymer 110 covering the bottom of the trench prevents the cavity from being etched deeper into the substrate. The etchant enlarges the cavity laterally forming second cavity etch walls 112 that are spaced at a greater lateral distance from the opening than the lateral walls 108 of the first cavity etch (step 202).

In step 210 of FIG. 2 the polymer may be removed from the cavity using an ashing step, as shown in FIG. 1F. This step is optional if the final trench width has not been achieved. In the example embodiment a plasma ashing step containing oxygen is used. The ashing conditions are described previously.

In step 212 of FIG. 2, a determination may be made to see if the target cavity width has been achieved. If the target cavity width is achieved the wafers may be sent on to the next process step in the manufacturing flow (step 214 in FIG. 2).

If, however, the target cavity width is not achieved, the wafers may be returned to step 204 in FIG. 2 and the process of polymer deposition followed by another cavity etch step may be repeated until the target width is achieved.

A second polymer deposition step followed by a third cavity etch is illustrated in FIG. 1G through FIG. 1J. More than three cycles of polymer deposition, cavity etch, and polymer removal may be performed to achieve the desired cavity width without etching the cavity deeper.

In FIG. 1G (step 204 of FIG. 2), polymer is deposited onto the cavity sidewalls 108 and 112.

In FIG. 1H (step 206 of FIG. 2), an optional ashing step is performed to remove the polymer 114 from the lateral sidewalls 112 of the cavity if it is needed.

In FIG. 1I (step 208 of FIG. 2), a third cavity etch is performed. The polymer 114 on the bottom of the cavity walls 108 and 112 prevents the cavity from being etched deeper into the silicon. The exposed second cavity etch walls 112 are etched laterally away from the opening 106 to form third etch cavity walls 116.

In FIG. 1J, (step 210 of FIG. 2) the polymer is removed from the cavity by ashing. As shown in FIG. 1J, the width of the cavity is substantially wider than the depth of the cavity. As an example, the width may be approximately twice the depth or more. This cavity is formed without the addition of an etch stop layer in the substrate which may add significant complexity and cost to the manufacturing flow. Cavities formed when an etch stop layer is used typically have a uniform depth across the width of the cavity. The depth of the cavity formed using the embodiment process is not uniform in depth across the width of the cavity as is illustrated in FIG. 1F and FIG. 1J.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a cavity in a substrate comprising:
    forming a masking layer on the substrate;
    forming an opening in the masking layer;
    performing a first cavity etch through the opening to form a cavity under the opening wherein the first cavity etch etches both laterally and vertically;
    depositing a polymer through the opening onto the bottom and sidewalls of the cavity wherein the polymer is thicker on the bottom of the cavity than on the sidewalls of the first cavity;
    removing the polymer from the sidewalls of the first cavity;
    performing a second cavity etch through the opening and etching the sidewalls of the cavity to increase a width of the cavity without increasing a depth of the cavity, wherein the depth of the cavity is non-uniform across the width; and
    removing the polymer from the cavity.

2. The method of claim 1, further comprising;
    repeating a cycle of the depositing the polymer, performing the second cavity etch, and removing the polymer processes until the cavity reaches a target cavity width.

3. The method of claim 1, wherein the substrate is single crystal silicon and wherein the masking layer is a layer of silicon nitride overlying a layer of silicon dioxide.

4. The method of claim 1, wherein the first cavity etch comprises a plasma etch using SF$_6$ and the polymer deposition comprises a plasma polymer deposition using a fluorocarbon.

5. The method of claim 1, wherein the step of removing the polymer comprises a plasma ash containing oxygen.

6. A method of forming a cavity in an integrated circuit substrate comprising:
    forming a masking layer on the substrate;
    forming an opening in the masking layer;
    performing a first cavity etch using a SF$_6$ plasma through the opening to form a cavity under the opening in the masking layer wherein the first cavity etch etches both laterally and vertically; and
    repeating the following processes until the width of the cavity reaches a target cavity width:
        depositing a polymer on the bottom and sidewalls of the cavity using a fluorocarbon plasma wherein the polymer is thicker on the bottom of the cavity under the opening in the masking layer and wherein the polymer is thinner on the sidewalls of the cavity;
        removing the polymer from the sidewalls of the cavity;
        performing a second cavity etch using a SF$_6$ plasma through the opening and etching the sidewalls of the cavity to increase the width of the cavity, wherein the polymer on the bottom of the cavity blocks the second cavity etch from increasing the depth of the cavity; and
    removing the polymer from the first and second cavity;
    wherein when the width of the cavity reaches the target cavity width, the width is greater than the depth of the cavity and the depth of the cavity is non-uniform across the width of the cavity.

7. The method of claim 6, wherein removing the polymer comprises a plasma ash containing oxygen.

8. The method of claim 7, wherein the fluorocarbon is selected from the group consisting of CH$_4$, CHF$_3$, CH$_2$F$_2$, C$_2$F$_6$, C$_3$F$_6$, and C$_4$F$_8$.

9. The method of claim 8, wherein the masking layer is comprised of a layer of silicon nitride on top of a layer of silicon dioxide.

* * * * *